(12) United States Patent
Amano et al.

(10) Patent No.: US 6,194,776 B1
(45) Date of Patent: *Feb. 27, 2001

(54) SEMICONDUCTOR CIRCUIT DEVICE HAVING TRIPLE-WELL STRUCTURE IN SEMICONDUCTOR SUBSTRATE, METHOD OF FABRICATING THE SAME, AND MASK DEVICE FOR FABRICATION OF THE SAME

(75) Inventors: Teruhiko Amano; Masaki Tsukude, both of Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/850,111

(22) Filed: May 1, 1997

(30) Foreign Application Priority Data

Jan. 7, 1997 (JP) .................................................. 9-000565

(51) Int. Cl.$^7$ .................................................. H01L 29/00
(52) U.S. Cl. .......................... 257/550; 257/372; 257/373; 257/544; 257/547; 257/901
(58) Field of Search .................................. 257/371, 372, 257/373, 544, 547, 548, 550, 901; 438/220, 223

(56) References Cited

U.S. PATENT DOCUMENTS

| Re. 35,442 | * | 2/1997 | Contiero et al. | 257/370 |
| Re. 35,486 | * | 4/1997 | Bertotti et al. | 257/555 |
| T969,010 | * | 4/1978 | Berger et al. | 257/477 |
| 5,331,193 | * | 7/1994 | Mukogawa | 257/371 |
| 5,818,099 | * | 10/1998 | Burghartz | 257/548 |
| 5,990,535 | * | 11/1999 | Palara | 257/500 |
| 6,054,741 | * | 4/2000 | Tokunaga | 257/371 |

FOREIGN PATENT DOCUMENTS

| 2-196460 | 8/1990 | (JP) . |
| 3-30468 | 2/1991 | (JP) . |

* cited by examiner

*Primary Examiner*—Mahshid Saadat
*Assistant Examiner*—George C. Eckert, II
(74) *Attorney, Agent, or Firm*—Oblon, Spivak, McClelland, Maier & Neustadt, P.C.

(57) ABSTRACT

A semiconductor circuit device having a triple-well structure wherein a predetermined potential level is supplied to a top well without a contact region formed in the top well is disclosed. In an N-type ion implantation step for forming an N-type well region (1) in a P-type semiconductor substrate (5), a mask of a predetermined configuration is used so that ions are not implanted into a region of a portion which is to serve as a bottom portion (1B) of the well region (1). Then, the N-type well region (1) is formed which is shaped such that a portion (6) having P-type properties remains partially in the bottom portion (1B). The P-type portion (6) establishes electrical connection between a P-type well region (2) and the semiconductor substrate (5) to permit the potential applied to a contact region (4) to be supplied to the well region (2) therethrough. The portion (6) may include a plurality of portions (6) which allow uniform potential supply. This structure may be applied to basic cells of a memory cell array block.

12 Claims, 18 Drawing Sheets

US 6,194,776 B1

SEMICONDUCTOR CIRCUIT DEVICE HAVING TRIPLE-WELL STRUCTURE IN SEMICONDUCTOR SUBSTRATE, METHOD OF FABRICATING THE SAME, AND MASK DEVICE FOR FABRICATION OF THE SAME

BACKGROUND OF THE INVENTION

1. Field of the Invention

The present invention relates to semiconductor circuit devices and a method of fabricating the same and, more particularly, to those including semiconductor devices having a triple-well structure, for example, an active device such as a MOS transistor, a CMOS circuit, and a storage device such as a memory cell array. The present invention also relates to a pattern constructing technique for a mask device serving as an equipment for fabrication of such semiconductor circuit devices.

2. Description of the Background Art

Semiconductor integrated circuit devices, particularly memory devices and the like, are required to reduce the influences of noises from a semiconductor substrate (effect (1)). More specifically, variations in GND potential applied to the substrate varies the back bias potential of a well region of a MOS transistor, varying the threshold value of the transistor accordingly. Thus, such influences must be prevented. Furthermore, memory devices and the like are required to prevent memory cell data destruction resulting from the injection of a minority carrier current from the substrate into storage nodes of basic memory cells (effect (2)).

From the above described viewpoint, it is a common practice for memory devices and the like to employ a triple-well structure wherein an N-type well region produced in a P-type semiconductor substrate completely surrounds a P-type well region of a memory cell array block comprised of an NMOS transistor, thereby accomplishing the effects (1) and (2).

FIG. 22 is a cross-sectional view of a semiconductor device having a conventional triple-well structure as disclosed in Japanese Patent Application Laid-Open No. 3-30468 (1991), for example. As illustrated in FIG. 22, a P-type well region 2P is completely surrounded by an N-type well region 1P produced in a P-type semiconductor substrate 5P. A P-type contact region 3 for supplying the potential level of the P-type well region 2P is formed in a part of the P-type well region 2P which lies between a part of an insulation film 14P adjacent the inner periphery of a sidewall portion 1PW of the N-type well region 1P and a part of the insulation film 14P adjacent a first source/drain region 18P. A potential VBB is supplied from the exterior to the contact region 3 to fix the potential of the P-type well region 2P at the potential VBB. A ground potential GND is supplied to a contact region 4P to fix the potential of the P-type semiconductor substrate 5P at the potential GND.

However, the use of the triple-well structure as shown in FIG. 22 accomplishes the effects (1) and (2) of the above descried triple-well structure but involves the need to provide in the P-type well region 2P the contact region 3 for supplying the potential to the P-type well region 2P in the triple-well structure. This results in the increased chip area of the semiconductor circuit device by the amount of the area occupied by the contact region 3 in the conventional triple-well structure as represented in FIG. 22.

Additionally, in the conventional triple-well structure as shown in FIG. 22, the contact region 3 must be positioned at a peripheral position offset from the center toward the sidewall portion 1PW in the P-type well region 2P for structural reasons. Then, uniform supply of the potential throughout the P-type well region 2P is not insured.

More high-capacity DRAMs have been constructed such that a memory cell array is divided into sub-arrays for low power consumption and high speed operation. In such a case, a divided word line structure comprised of main word lines and sub-word lines is sometimes employed as an example of word line structures to increase the operating speed of word drivers. In a semiconductor integrated circuit device having such a divided word line structure, if sub-decode circuits for the sub-word lines are comprised of CMOS circuits and located around a memory cell array sub-block, the memory cell array sub-block is surrounded by N-type well regions for PMOS transistors since sense amplifier circuit bands and sub-decode circuit bands positioned to surround the memory cell array sub-block are comprised of CMOS circuits. Such a construction makes it extremely difficult to position the contact region for supplying the potential of the P-type well region of the memory cell array sub-block within the memory cell array sub-block. As a result, the conventional triple-well structure fails to be applied to the semiconductor integrated circuit device having the divided word line structure.

Japanese Patent Application Laid-Open No. 2-196460 (1990) proposes a conventional triple-well structure similar to that illustrated in FIG. 22 for decreasing the area occupied by a chip to reduce the size of a CMOS transistor. This technique, however, is not effective to solve the above described problems approached by the present invention since a P-type contact layer for supplying a fixed potential VSS is formed in an upper corner portion of a P-type well region immediately under each region of the transistor as illustrated in FIG. 1 of the above described reference. Additionally, this technique employs the conventional N-type well region with one sidewall portion thereof completely removed in place of the N-type well region completely surrounding the P-type well region. Then, one side surface of the P-type well region is entirely connected to a P-type substrate. This structure increases the minority carrier current injected from the substrate, creating the new problem of losing the great majority of the original functions and effects of the triple-well structure.

Therefore, the technique disclosed in Japanese Patent Application Laid-Open No. 2-196460 (1990) is not practicable.

SUMMARY OF THE INVENTION

According to a first aspect of the present invention, a semiconductor circuit device comprises: a semiconductor substrate of a first conductivity type; a first well region of the first conductivity type extending from a first region of a surface of the semiconductor substrate into the semiconductor substrate; a second well region of a second conductivity type extending from a second region of the surface of the semiconductor substrate adjacent the first region into the semiconductor substrate so as to surround the first well region; at least one transistor comprising first and second transistor regions of the second conductivity type extending from the first region of the surface of the semiconductor substrate into the first well region, and a third transistor region formed on the first region of the surface between the first and second transistor regions; and at least one conduction region formed partially in a bottom portion of the second well region for providing electrical continuity between the first well region and the semiconductor substrate, wherein a contact region for supplying a predetermined potential to the first well region is not formed in the first well region.

The second well region almost completely surrounds the first well region to block almost all of the minority carriers from being injected from the semiconductor substrate into the first well region. In general, the space on the surface of the first well region is occupied by the transistor and the insulation layer for bounding the active area. Then, there is no space for the contact region on the surface.

In this state, the contact region is not formed in the first region of the surface, but only the conduction portion formed in the bottom portion establishes electrical connection between the first well region and the semiconductor substrate. In other words, the conduction portion functions as the sole fixed potential supply path for the first well region.

Preferably, according to a second aspect of the present invention, in the semiconductor circuit device of the first aspect, the at least one conduction region is of the first conductivity type.

The conduction region which is of the same conductivity type as the semiconductor substrate may ensure the electrical connection between the first well region and the semiconductor substrate without forming an interface between the conduction region and the first well region and an interface between the conduction region and the semiconductor substrate.

Preferably, according to a third aspect of the present invention, in the semiconductor circuit device of the second aspect, the at least one conduction region comprises a plurality of conduction regions formed throughout the bottom portion of the second well region.

Each of the conduction regions establishes electrical connection between the first well region and the semiconductor substrate. Then, the locally supplied potential of the semiconductor substrate is more uniformly supplied throughout the first well region. The more the conduction regions, the more uniform the potential supply to the first well region.

Preferably, according to a fourth aspect of the present invention, in the semiconductor circuit device of the second aspect, the at least one conduction region is formed in other than parts of the bottom portion which are located immediately under the first, second, and third transistor regions.

If the minority carriers are injected from the semiconductor substrate through the conduction region into the first well region, almost all of the minority carriers do not enter the first, second, and third transistor regions but reach only a region other than the transistor regions which is located over the conduction region. This prevents the malfunction of the transistor resulting from the minority carriers to allow the original functions and effects of the triple-well structure to be maintained more completely.

Preferably, according to a fifth aspect of the present invention, the semiconductor circuit device of the second aspect further comprises: a first insulation layer portion formed in a part of the first region which is surrounded by the first and second transistor regions and a sidewall portion of the second well region extending vertically downwardly from the second region into the semiconductor substrate, the first insulation layer portion for bounding the first area; a second insulation layer portion formed in a part of the surface of the semiconductor substrate which is located adjacent to and exteriorly of the second region so as to surround the second region; and a contact region extending from a part of the surface of the semiconductor substrate which is located exteriorly of the second insulation layer portion into the semiconductor substrate, the contact region for supplying a potential.

Preferably, according to a sixth aspect of the present invention, in the semiconductor circuit device of the fifth aspect, the at least one conduction region is formed in a part of the bottom portion which is located immediately under the first insulation layer portion.

Preferably, according to a seventh aspect of the present invention, the semiconductor circuit device of the second aspect is a memory cell array block, the memory cell array block comprising a plurality of sub-blocks, wherein the at least one transistor includes a plurality of transistors corresponding respectively to MOS transistors of basic memory cells in each of the plurality of sub-blocks.

The potential of the semiconductor substrate may be supplied to the first well regions without the provision of the potential fixing contact region in the first well regions of the memory cell array block.

Preferably, according to an eighth aspect of the present invention, in the semiconductor circuit device of the seventh aspect, the at least one conduction region comprises a plurality of conduction regions formed throughout the bottom portion of the second well region.

Preferably, according to a ninth aspect of the present invention, in the semiconductor circuit device of the seventh aspect, the at least one conduction region is formed in other than parts of the bottom portion which are located immediately under the first, second, and third transistor regions.

In accordance with the ninth aspect of the present invention, in particular, the conduction region of each basic memory cell is formed in the bottom portion of the second well region immediately under other than the transistor regions. Therefore, almost all of the minority carriers injected from the semiconductor substrate do not reach the source/drain regions of each basic memory cell.

Preferably, according to a tenth aspect of the present invention, in the semiconductor circuit device of the second aspect, the at least one conduction region is formed by implanting ions of the second conductivity type into a predetermined part of the semiconductor substrate to form the bottom portion so that the ions are not implanted into a part of the predetermined part of the semiconductor substrate.

This provides the bottom portion of the second well region having a novel structure in the semiconductor substrate in easy and practical manner.

According to an eleventh aspect of the present invention, a method of fabricating a semiconductor circuit device comprises the steps of: preparing a semiconductor substrate of a first conductivity type; forming in the semiconductor substrate a bottom portion of a second well region of a second conductivity type partially including an opening pattern filled with a material for electrical conduction to the semiconductor substrate to form a region corresponding to a first well region of the first conductivity type between a first region of a surface of the semiconductor substrate and the bottom portion; forming regions of a transistor on and in the surface of the semiconductor substrate in the first region; and forming a sidewall portion of the second well region of the second conductivity type between a second region of the surface of the semiconductor substrate adjacent the first region and a part of the bottom portion which is located immediately under the second region, whereby the second well region including the bottom portion and the sidewall portion surrounds the region corresponding to the first well region of the first conductivity type to define the first well region.

Preferably, according to a twelfth aspect of the present invention, in the method of the eleventh aspect, the step of preparing the semiconductor substrate comprises the step of forming an insulation layer on and in the surface of the semiconductor substrate, the insulation layer for bounding the first region and an active area of the transistor; and the step of forming the bottom portion comprises the steps of forming a resist layer on an upper surface of the insulation layer within an extent corresponding to the size of the opening pattern, and implanting ions of the second conductivity type into the semiconductor substrate using the resist layer as a mask to form the bottom portion.

Preferably, according to a thirteenth aspect of the present invention, in the method of the twelfth aspect, the step of forming the resist layer comprises the step of forming the resist layer by a photolithographic process using a photomask device having a predetermined pattern configuration corresponding to the opening pattern.

Preferably, according to a fourteenth aspect of the present invention, in the method of the thirteenth aspect, the opening pattern comprises a plurality of opening patterns.

Preferably, according to a fifteenth aspect of the present invention, in the method of the eleventh aspect, the semiconductor circuit device is a memory cell array block; the memory cell array block comprises a plurality of sub-blocks; and the transistor includes a plurality of transistors corresponding respectively to MOS transistors of basic memory cells in each of the plurality of sub-blocks.

A sixteenth aspect of the present invention is also intended for a mask device for fabrication of a semiconductor circuit device having a triple-well structure in a semiconductor substrate. According to the present invention, the mask device comprises: a mask pattern for forming at least one opening pattern in a part of a bottom portion of a second well region of a second conductivity type for surrounding a first well region of a first conductivity type wherein regions of a transistor are to be formed in a wafer process step of forming the bottom portion in the triple-well structure.

The mask device is required only to newly form the mask pattern, but does not require a new fabrication step and a new fabrication device when an actual semiconductor integrated circuit device is fabricated, accomplishing the fabrication of the semiconductor integrated circuit device having the novel triple-well structure.

In accordance with the first to tenth aspects of the present invention, the second well region almost completely surrounds the first well region including the respective transistor regions, and the conduction region is partially provided in the bottom portion of the second well region. This eliminates the need to provide the contact region for supplying the potential to the first well region in the first well region. The area required to provide the semiconductor device having the triple-well structure on the semiconductor substrate may be much less than that of the background art while the original functions of the triple-well structure is fundamentally maintained. Therefore, the size reduction of the entire device is promoted.

In particular, in accordance with the second aspect of the present invention, the conduction region is of the same conductivity type as the first well region and the semiconductor substrate to ensure the electrical connection between the first well region and the semiconductor substrate with low power loss without the formation of the junction interface.

Additionally, in accordance with the third aspect of the present invention, the plurality of conduction regions are provided in the bottom portion of the second well region to uniformly supply the potential to be applied to the first well region throughout the first well region. As the uniformity of the distribution of the conduction regions in the bottom portion increases, the uniformity of the potential supply may be enhanced.

Further, in accordance with the fourth aspect of the present invention, the conduction region is provided in the bottom portion immediately under the surface of other than the transistor regions. This prevents a transistor malfunction resulting from the minority carriers injected from the semiconductor substrate through the conduction region into the first well region and reaching the respective transistor regions. Thus, the original functions and effects of the triple-well structure may be exhibited more positively.

Furthermore, in accordance with the seventh aspect of the present invention, the semiconductor circuit device may supply the predetermined potential from the semiconductor substrate to the first well region of each basic memory cell array in the memory cell array block while taking full advantage of the triple-well structure without the provision of the potential supplying contact region in the first well region in the memory cell array block. In particular, when the fourth aspect of the present invention is applied to the basic memory cells in the memory cell array block, the minority carriers injected from the semiconductor substrate through the conduction regions into the first well regions are prevented from reaching the storage nodes of the basic memory cells. This prevents data destruction in the basic memory cells due to the injection of the minority carrier current.

In accordance with the eleventh aspect of the present invention, the method may achieve in the semiconductor circuit device a semiconductor device having substantially perfect triple-well structure for supplying the potential from the semiconductor substrate to the first well region without the provision of the contact region in the first well region. In particular, the first, third and fourth steps are the existing steps, and the second step may be accomplished by changing the corresponding existing step. Thus, the semiconductor device may be relatively readily fabricated. For embodying the second step using the photomask, only the pattern of the photomask should be changed. For other steps, the existing fabrication method may be utilized as it is. This further enhances the ease of fabrication.

In accordance with the sixteenth aspect of the present invention, the opening pattern may be readily formed in the bottom portion of the second well region only by applying the mask pattern to the ion implantation step including the existing photolithographic step. The use of the mask device of the present invention eliminates the need to use a new step and fabrication device for forming the opening pattern during the fabrication. Additionally, the existing mask pattern fabrication process may be used to form the mask pattern itself.

It is therefore a primary object of the present invention to provide a semiconductor circuit device having a triple-well structure which is capable of supplying a predetermined potential level to a first well region which is the top layer of the triple-well structure without particularly providing a contact region for supplying the potential level to the first well region while maintaining the original effects of the triple-well structure which are the reduction in influence of noises from a semiconductor substrate and the prevention of the influence of a minority carrier current in the substrate injected into a storage node of a basic memory cell.

It is another object of the present invention to uniformly supply potential to the first well region.

It is still another object of the present invention to more completely accomplish the original effect of the triple-well structure which is the prevention of the injection of a minority carrier current into respective regions of a transistor.

It is a further object of the present invention to achieve a method of fabricating a semiconductor circuit device having such a new triple-well structure, and a mask device having a novel pattern and used for the method.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 5A, and 7A–17A are cross-sectional views illustrating background art fabrication steps;

FIGS. 5B, and 7B–17B are cross-sectional views illustrating steps of fabrication of the modification of the first preferred embodiment;

DESCRIPTION OF THE PREFERRED EMBODIMENTS (Overview)

Description will now be given on semiconductor integrated circuit devices (referred to hereinafter as semiconductor circuit devices in a broader sense) of preferred embodiments of the present invention, which comprise, as examples, an NMOS transistor employed as an active device and an NMOS transistor applied as a storage device to a memory cell array for purposes of convenience. More specifically, in the process step (N-type ion implantation step) of producing an N-type second well region in a P-type semiconductor substrate, a photomask having a predetermined pattern is applied to lithography in this step to form a predetermined resist pattern. Then, using the resist pattern as a mask, N-type ions are implanted so that a part of the bottom of the second well region is not implanted with the N-type ions, thereby forming a conduction region having P-type properties in the part of the bottom of the N-type second well region. This achieves (1) a structure which allows electrical continuity between a P-type well region almost completely surrounded by the N-type second well region and the P-type semiconductor substrate, (2) the eliminated need to produce in the P-type first well region a peculiar P-type contact region for supplying potential to the P-type first well region, and (3) supply of a potential level to the P-type first well region almost completely surrounded by the N-type second well region through the P-type substrate.

Of course, the above described structure for the NMOS transistor may be applied to a PMOS transistor. In this case, the N-type corresponds to a first conductivity type and the P-type corresponds to a second conductivity type. The above described structure may be applied to one of the MOS transistors of a CMOS circuit.

Particular examples of the above described structure for the NMOS transistor will be discussed in detail with reference to the drawings.

(First Preferred Embodiment)

Figure 1:
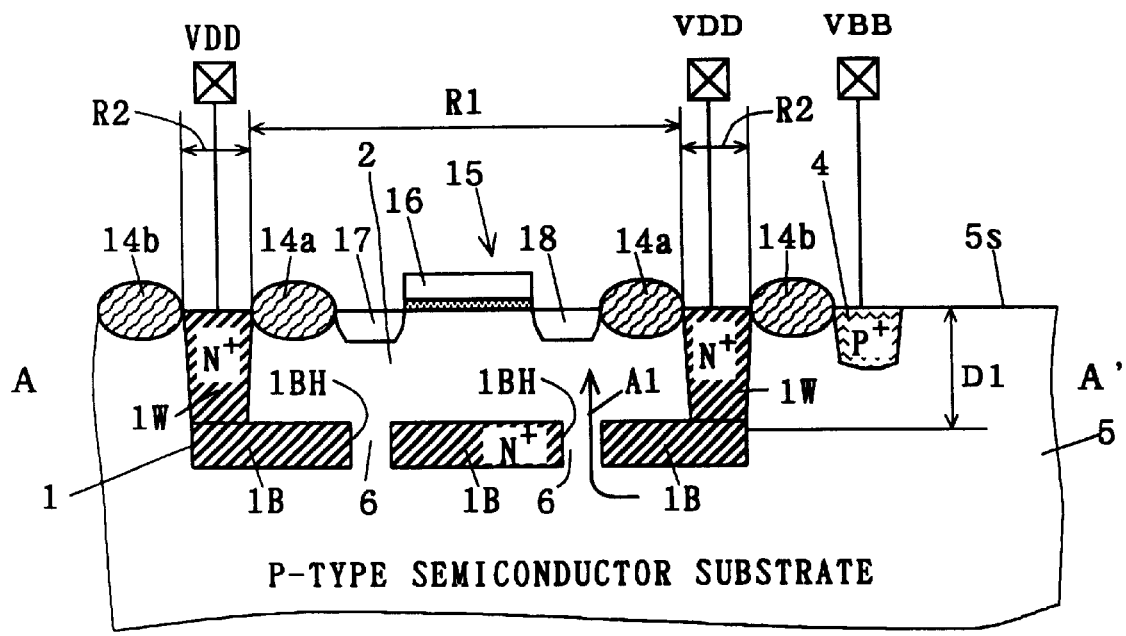
FIG. 1 is a cross-sectional view for illustrating a structure of a first preferred embodiment according to the present invention.
Figure 2:
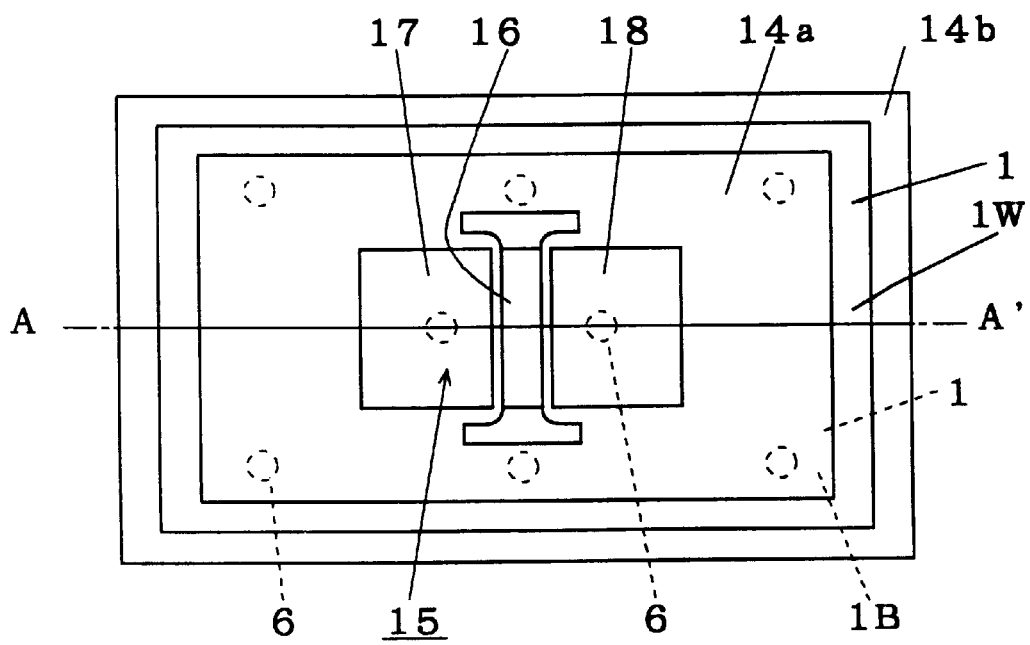
FIG. 2 is a plan view for illustrating the structure of the first preferred embodiment according to the present invention.

FIG. 1 is a cross-sectional view of an NMOS transistor having a novel triple-well structure. FIG. 2 is a schematic top view of the NMOS transistor. The vertical section taken along the line A–A' of FIG. 2 corresponds to the section of FIG. 1. Aluminum interconnect layers for electrode interconnection and interlayer dielectric films are not illustrated but only principal elements are illustrated in FIGS. 1 and 2.

The NMOS transistor device of the first preferred embodiment has a triple-well structure comprised of a P-type well region 2, an $N^+$ type well region 1, and a semiconductor substrate 5 which are arranged from the top toward the bottom and which serve as first, second and third well regions, respectively.

The P-type (first conductivity type) semiconductor substrate 5 is, for example, a Si substrate. An insulation layer 14 which is a LOCOS film is formed in and on a surface 5S of the semiconductor substrate 5, and includes portions 14a and 14b coupled together although not shown. An area in the surface 5S of the semiconductor substrate 5 which is bounded by the outer periphery of the insulation layer portion 14a for defining the extent of an active area of the NMOS transistor 15 is defined as a "first region R1 (having a width R1)". Then, the P-type well region 2 having a depth D1 is formed extending from the first region R1 into the semiconductor substrate 5.

A first source/drain region (first transistor region) 17 and a second source/drain region (second transistor region) 18 for the NMOS transistor 15 are formed extending from the first region R1 of the surface 5S corresponding to the active area into the P-type well region 2. A transfer gate layer 16 (third transistor region) is formed on the surface 5S within the first area R1 between the first and second source/drain regions 17 and 18. The layers 17, 18, and 16 of the NMOS transistor 15 are generically referred to as respective regions or transistor regions of the NMOS transistor.

The $N^+$ well region 1 includes a sidewall portion 1W having a depth D1 and extending vertically downwardly from a second region R2 (having a width R2) in the surface 5S adjacent the first region R1, that is, the surface 5S sandwiched between the insulation layer portions 14a and 14b into the semiconductor substrate 5 in such a manner that the sidewall portion 1W completely surrounds the entire outer peripheral surface of the P-type well region 2. The N+ well region 1 further includes a bottom portion 1B coupled to the ring-shaped sidewall portion 1W to substantially close the bottom surface of the P-type well region 2. Then, the P-type well region 2 (outer peripheral surface and bottom surface thereof) is almost completely surrounded by the N+ type well region 1 including the sidewall portion 1W and the bottom portion 1B except conduction regions 6 to be described below.

The conduction regions 6 which are the primary feature of the triple-well structure of the present invention comprises opening patterns 1BH filled with a P-type material and partially formed in the bottom portion 1B so as to be uniformly distributed throughout the bottom portion 1B. In this manner, the conduction regions 6 of the same conductivity type as the P-type well region 2 and semiconductor substrate 5 may establish electrical connection between the P-type well region 2 and the semiconductor substrate 5 with low power loss without forming an PN junction interface. In terms of this function, the conduction regions 6 may be defined as an opening pattern portion filled with a material which permits electrical continuity between the semiconductor substrate 5 and the P-type well region 2. The conduction regions 6 may be of a construction alternative to the above described construction filled with the P-type material so long as they achieve this function.

A P+ type contact region 4 for supplying a potential VBB from the exterior is formed extending from a part of the surface 5S which is outside the second region R2 into the semiconductor substrate 5.

Figure 22:
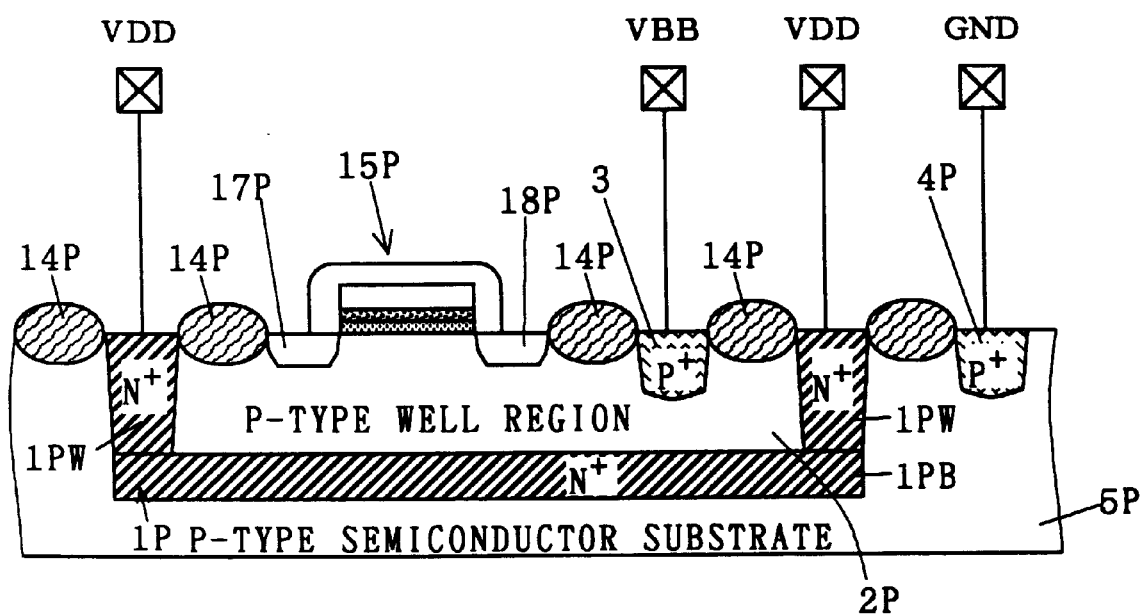
FIG. 22 is a cross-sectional view for illustrating a prior art triple-well structure.

The potential VBB is supplied from the exterior to the contact region 4 while the electrical connection is established between the P-type well region 2 and the P-type semiconductor substrate 5 through the portions 6 having P-type properties and serving as a conduction path. This eliminates the need to provide the prior art P-type contact region 3 as illustrated in FIG. 22 in the P-type first well region, and permits the potential VBB to be supplied from the semiconductor substrate 5 to the P-type well region 2.

Almost an entire outer periphery of the P-type well region 2 is surrounded by the N+ type well region 1 except the conduction regions 6. Therefore, the problems described with reference to Japanese Patent Application Laid-Open No. 2-196460 (the loss of the effects (1) and (2) of the triple-well structure) are not encountered. The device of FIGS. 1 and 2 successfully removes the conventional contact region 3 (FIG. 22) from the first well region to achieve the size reduction thereof while substantially satisfying the original effects (1) and (2) of the triple-well structure.

Additionally, the uniform distribution of the conduction regions 6 throughout the bottom portion 1B enables the potential VBB to be uniformly supplied throughout the P-type well region 2 without localization thereof. From this viewpoint, the above mentioned prior art problems are not created. It is apparent that this effect is enhanced as the number of conduction regions 6 increases.

In the above description, the plurality of conduction regions 6 are provided. However, a single conduction region 6 may be provided if the requirement to be satisfied is only the electrical continuity between the regions 2 and 5 for supply of the potential VBB to the P-type well region 2. This arrangement causes the problem of uneven potential supply to remain unsolved.

(Modification of First Preferred Embodiment)

In the arrangement of FIGS. 1 and 2, some of the conduction regions 6 provided in the N+ type well region 1 are located immediately under the source/drain regions 17 and 18. Such an arrangement, however, presents a new problem to be described below. As illustrated by the arrow A1 of FIG. 1, the conduction regions 6 function as a path for supplying the potential VBB and as inlet windows for minority carriers (electrons herein) in the semiconductor substrate 5 to be injected into the P-type well region 2. The inlet windows positioned immediately under the source/ drain regions 17 and 18 cause most of the minority carriers injected into the P-type well region 2 therethrough to reach the overlying source/drain regions 17 and 18. Then, the potential level of the source/drain regions 17 and 18 is varied. For example, the NMOS transistor 15 which has been "on" turns "off". This might cause the NMOS transistor 15 to malfunction. In terms of the malfunction, the same is true for the conduction region positioned just under a channel region immediately underlying the gate layer 16 of the NMOS transistor 15.

Figure 3:
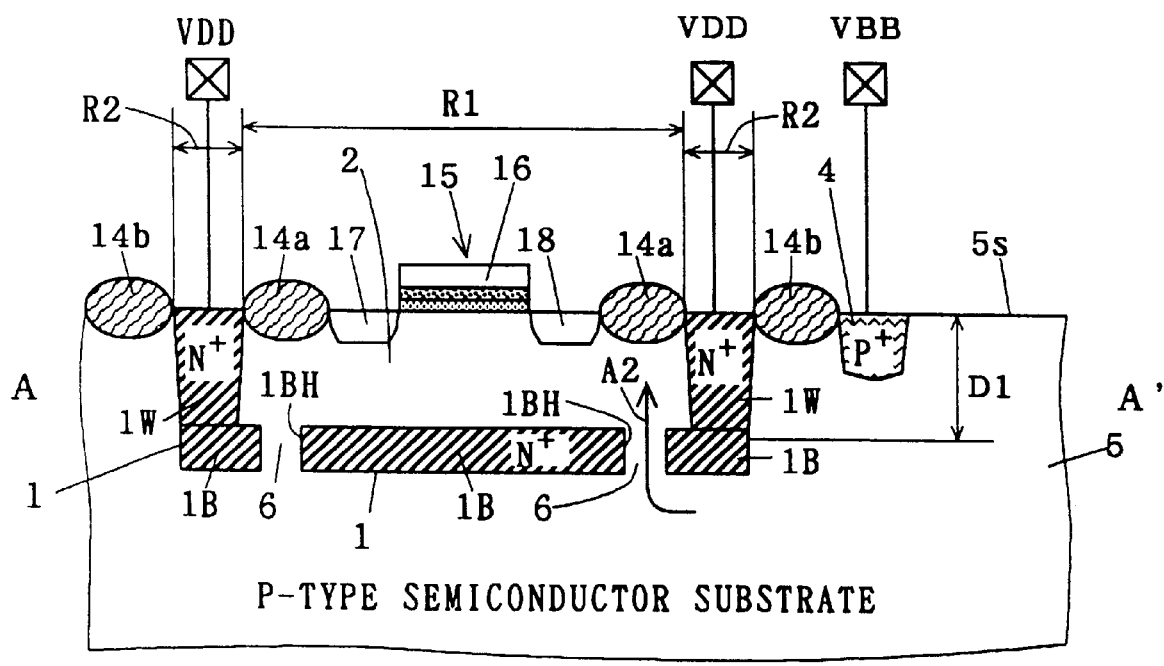
FIG. 3 is a cross-sectional view of a modification of the structure of the first preferred embodiment according to the present invention.
Figure 4:
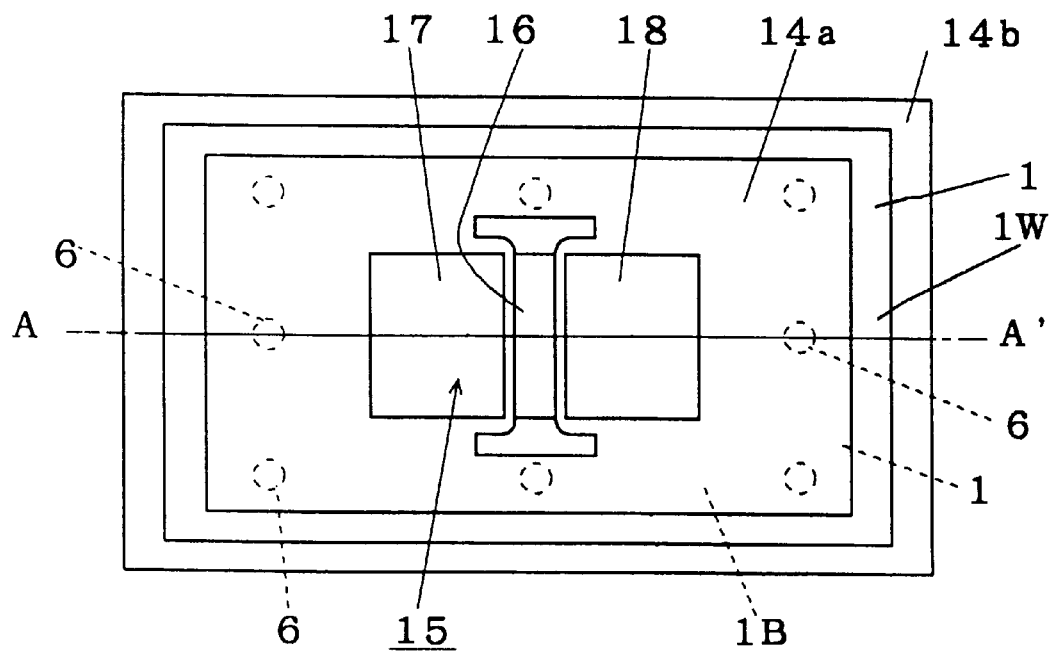
FIG. 4 is a plan view of the modification of the structure of the first preferred embodiment according to the present invention.

To solve the problem, the conduction regions 6 must be provided immediately under other than the transistor regions 16, 17, and 18. From this viewpoint, a modification of the first preferred embodiment as illustrated in FIGS. 3 and 4 is proposed to solve the above described new problem. FIGS. 3 and 4 correspond respectively to FIGS. 1 and 2, and like reference characters are used in FIGS. 3 and 4 to designate elements identical with those of FIGS. 1 and 2.

Referring to FIGS. 3 and 4, the modification of the first preferred embodiment features the provision of the conduction regions 6 in parts of the bottom portion 1B of the N+ type well region 1 which are positioned immediately under the insulation layer portion 14a on the outer periphery of the regions 17 and 18, but not in parts of the bottom portion 1B which are positioned immediately under the source/drain regions 17 and 18. In such an arrangement, most of the minority carriers injected from the substrate 5 through the regions 6 reach only the overlying insulation layer portion 14a as illustrated by the arrow A2 of FIG. 3, but do not reach the source/drain regions 17 and 18. This prevents the potential variations in the respective transistor regions due to the minority carrier injection current. The functions and effects of the potential supply and size reduction described with reference to FIGS. 1 and 2 hold true for the conduction regions 6 of the modification. In this sense, the modification is a more preferred mode to embody the present invention.

In this modification, the plurality of conduction regions 6 may be provided to uniform the fixed potential supply or the single conduction region 6 may be provided.

(Method of Fabrication of First Preferred Embodiment and Mask Used Therein)

Figure 7A:
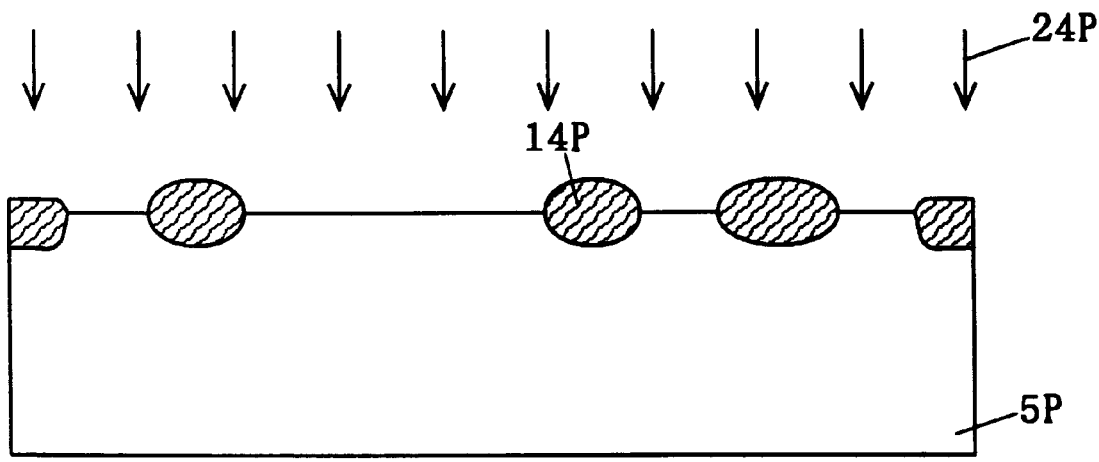

A method of fabricating the NMOS transistor device shown in FIG. 3 will be described with reference to FIGS. 5B and 7B–17B which are cross-sectional views illustrating respective fabrication steps. For purposes of comparison, background art fabrication steps corresponding to the steps shown in FIGS. 5B and 7B–17B are illustrated in FIGS. 5A and 7A–17A, respectively. There are fundamental differences between the arrangements of FIGS. 7A and 7B, between the arrangements of FIGS. 8A and 8B, and between the arrangements of FIGS. 14A and 14B. Reference characters in the background art steps shown in FIGS. 5A and 7A–17A are followed by the letter "P" to designate elements corresponding to those of FIGS. 5B and 7B–17B.

(1) First Step (Field Step)

Figure 5A:
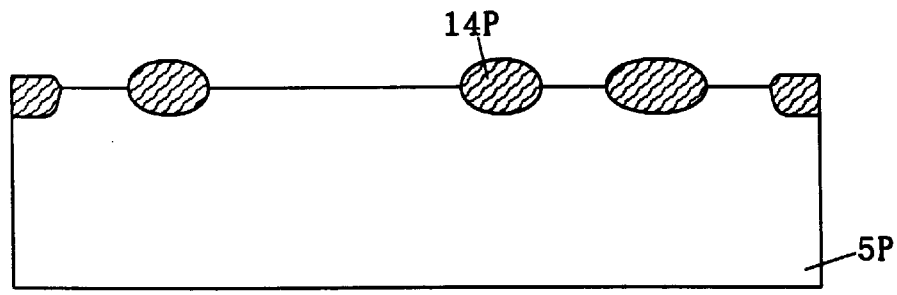
Figure 5B:
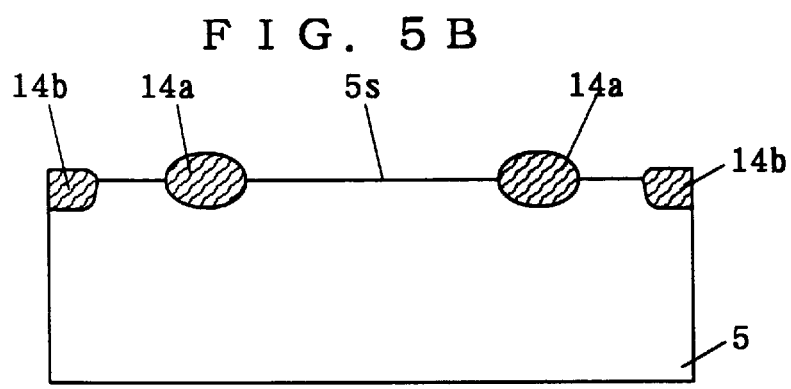

Referring to FIG. 5B, the P-type semiconductor substrate 5 is prepared wherein the portions 14a and 14b of the LOCOS insulation layer 14 for defining the active area are formed on the surface 5S thereof.

(2) Second Step (Step of Implantation of First and Second Islands)

In the second step, the bottom portion 1B (FIG. 3) partially including the opening patterns filled with the material electrically conductive to the semiconductor substrate 5 is formed in the semiconductor substrate 5 to define a P-type region corresponding to the first well region 2 (FIG. 3) in the semiconductor substrate 5 between the surface 5S and the bottom portion 1B.

Figure 6:
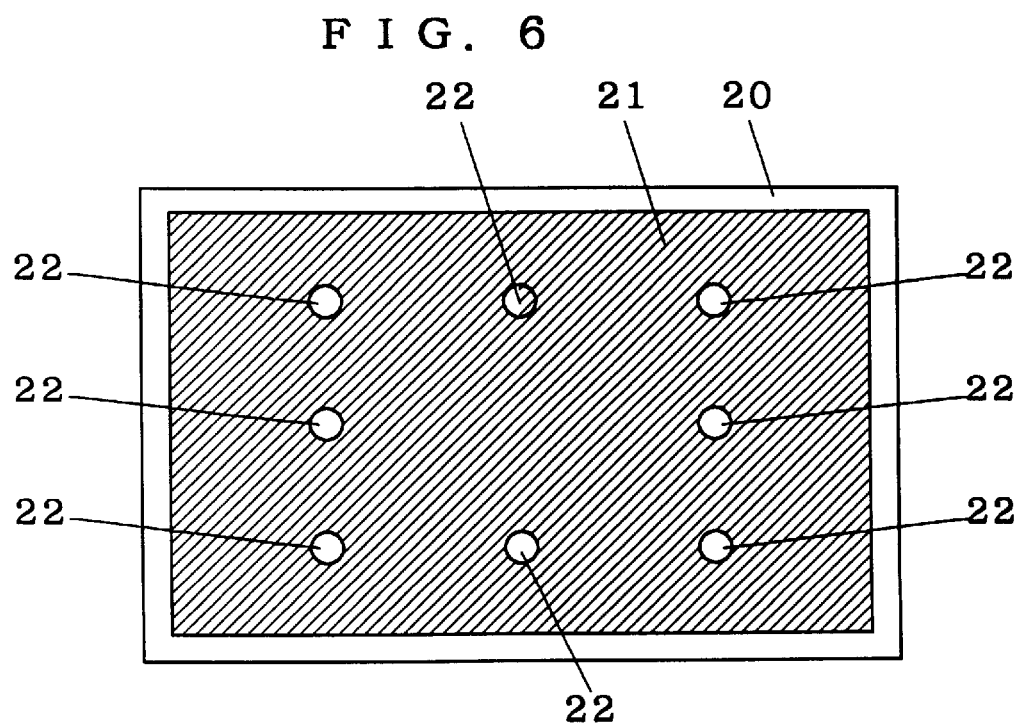
FIG. 6 is a schematic plan view of a mask device according to the present invention.

First, a mask device 20 having a novel pattern is prepared as schematically illustrated in the plan view of FIG. 6. The mask device 20 is schematically shown as provided for forming the bottom of the second well region and the conduction regions for the single MOS transistor, and employs a negative photoresist. More specifically, the mask device 20 comprises a chromium-film mask pattern 21 formed on an upper surface of a matrix of the mask device 20 and provided with at least one opening pattern 22 corresponding to the opening patterns 1BH for bounding the conduction regions 6 shown in FIG. 3. The mask pattern 21 itself may be formed by the existing known technique.

Mask patterns reverse to the mask patterns 21 are used when a positive photoresist is used.

Figure 7B:
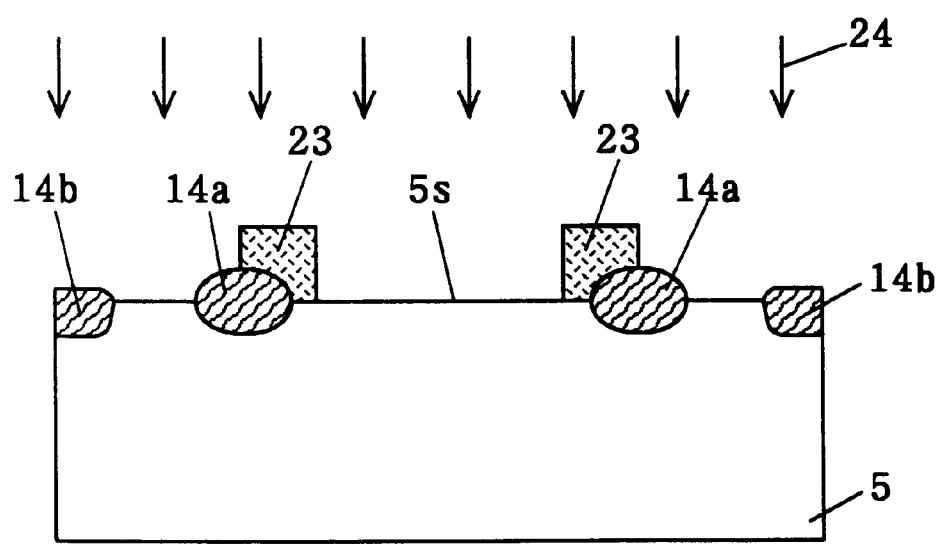
Figure 8A:
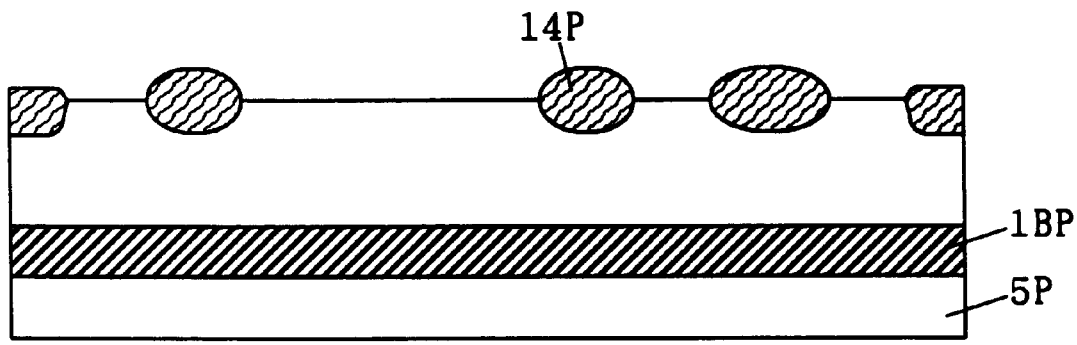

Next, a photoresist is formed to cover the surface 5S of the semiconductor substrate 5 and the insulation layer 14 to form resist layers 23 as shown in FIG. 7B by the known photolithographic process using the mask device as depicted in FIG. 6. The opening patterns 1BH of FIG. 3 are to be formed immediately under the resist layers 23.

With continued reference to FIG. 7B, using the resist layers 23 as a mask, N-type ions 24 such as phosphorus are implanted from the surface 5S into the substrate to the depth D1. Thereafter, the resist layers 23 are removed.

Figure 8B:
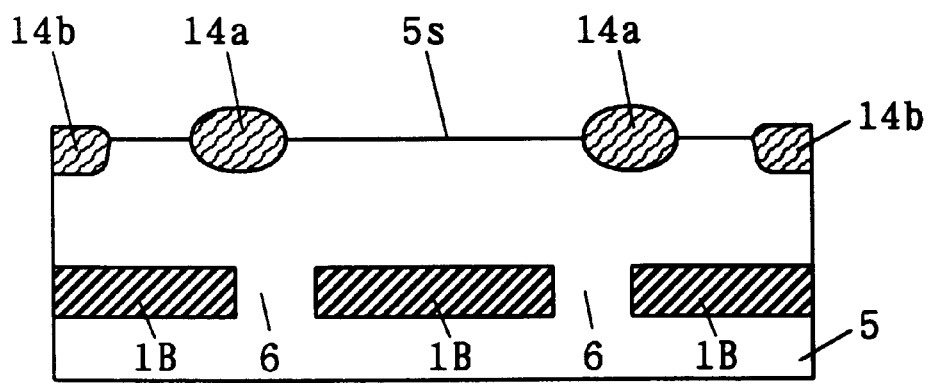

In the wafer process step for forming the bottom portion of the second well region which comprises the photolithographic step and the N-type ion implantation step, the conduction portions 6 filled with the P-type impurities in the semiconductor substrate 5 and the bottom portion 1B having the opening patterns for the conduction portions 6 are formed in the substrate 5 substantially in parallel with the surface 5S (FIG. 8B).

Figure 9A:
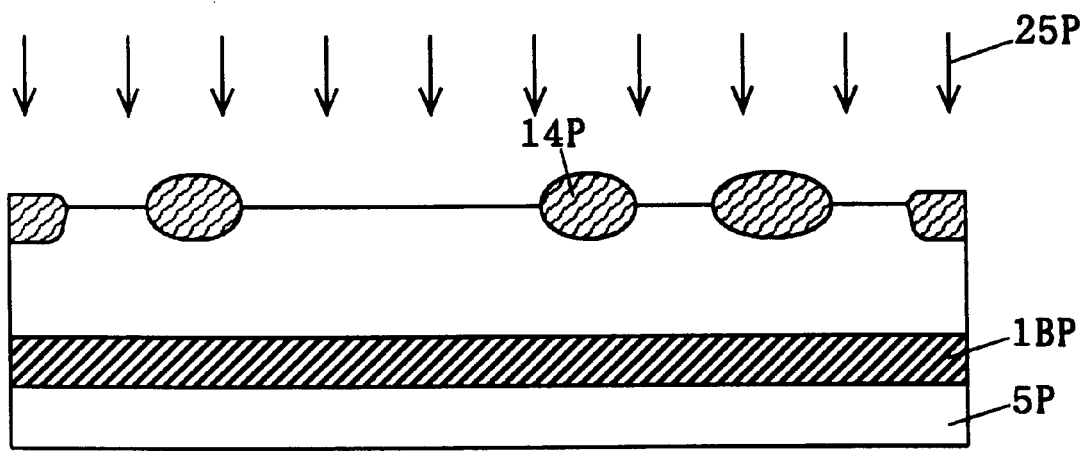
Figure 9B:
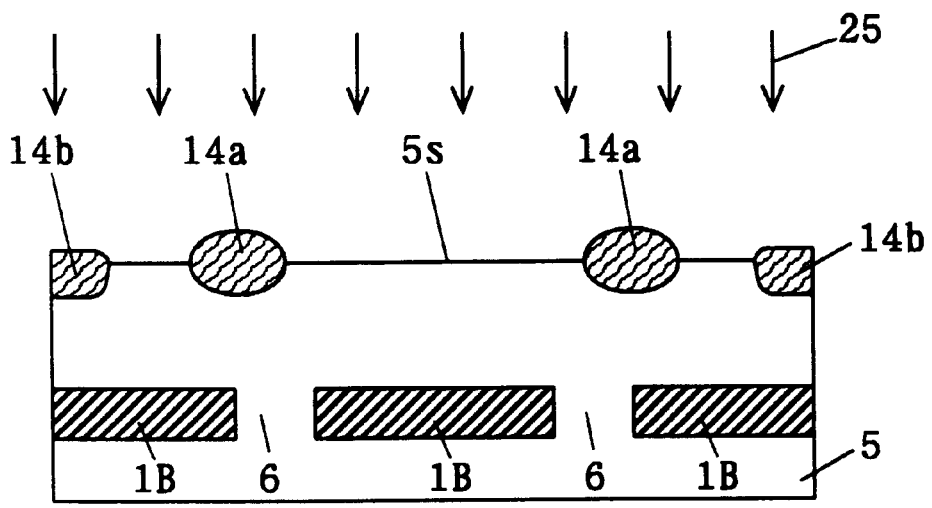
Figure 10A:
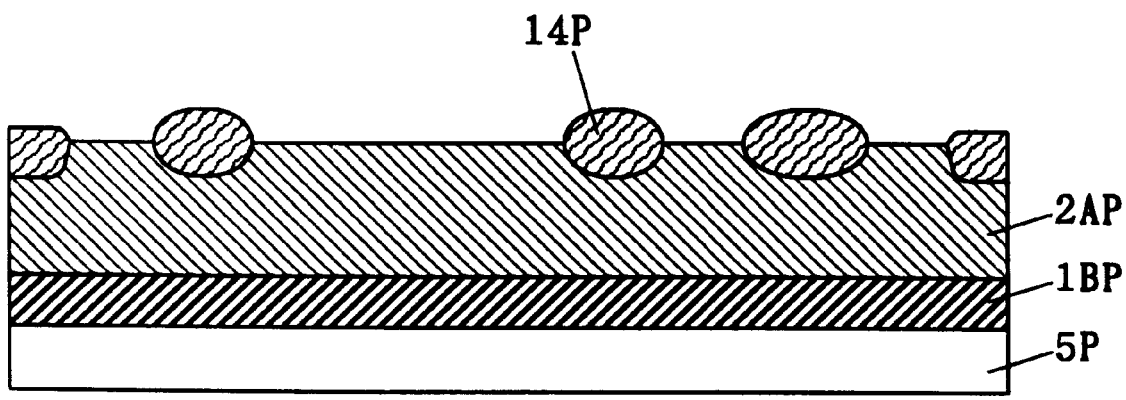
Figure 10B:
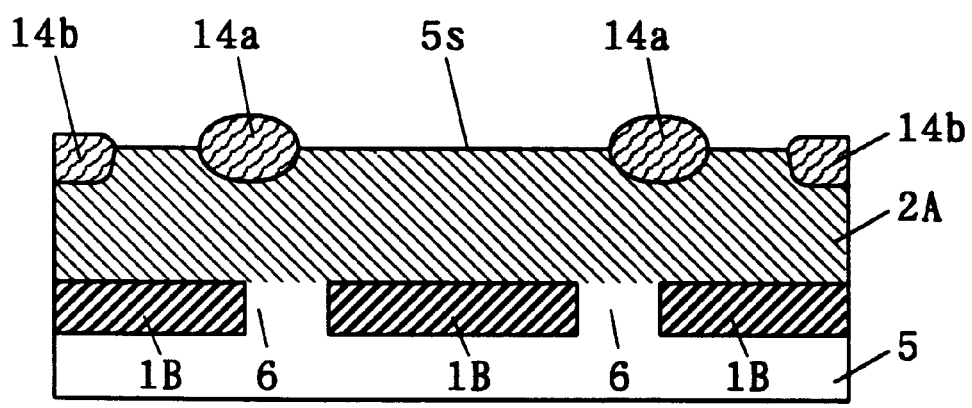

Referring to FIG. 9B, P-type ions 25 such as boron are implanted from the exposed surface 5S into the semiconductor substrate 5 down to the upper surface of the bottom portion 1B to form a P-type layer 2A (FIGS. 10B). The P-type layer 2A is the basis of the first well region 2 of FIG. 3.

(3) Third Step

The third step is a step for forming the respective regions 16 to 18 of the transistor 15 of FIG. 3 and mainly comprises a transfer gate formation step, an N-channel source/drain implantation step, and a P$^+$ channel step.

Figure 11A:
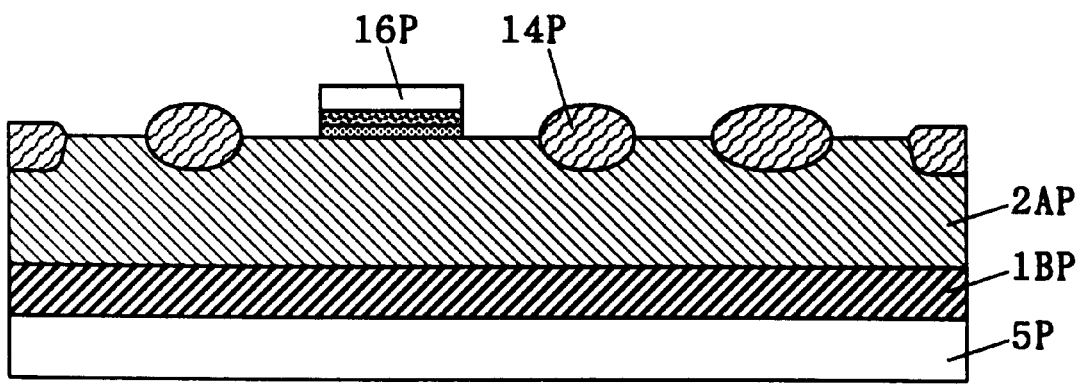
Figure 11B:
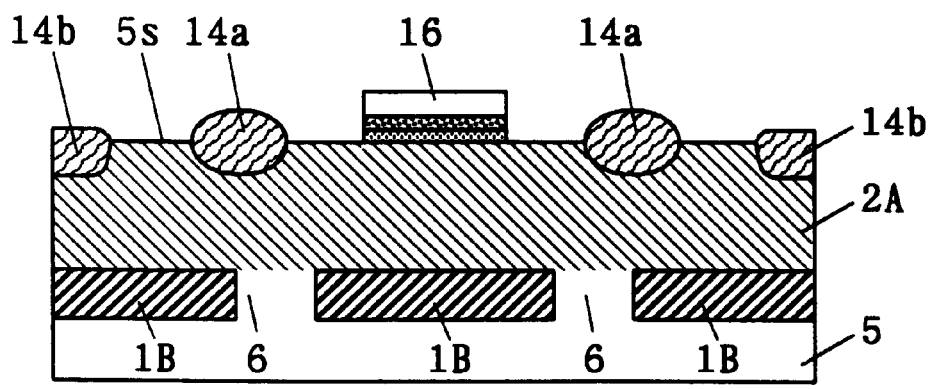

First, as illustrated in FIG. 11B, the transfer gate 16 is centrally formed on the surface 5S serving as the active area by the known process.

Figure 12A:
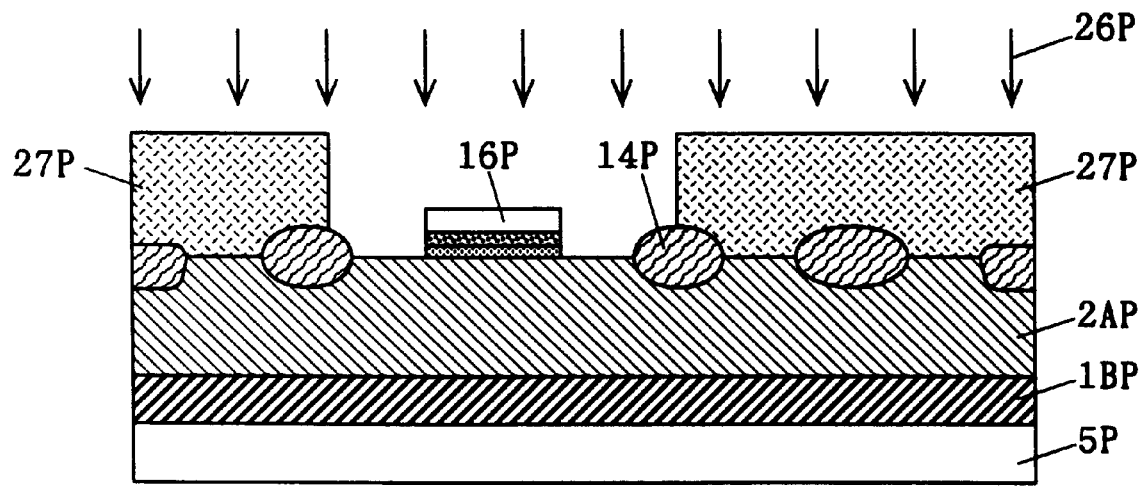
Figure 12B:
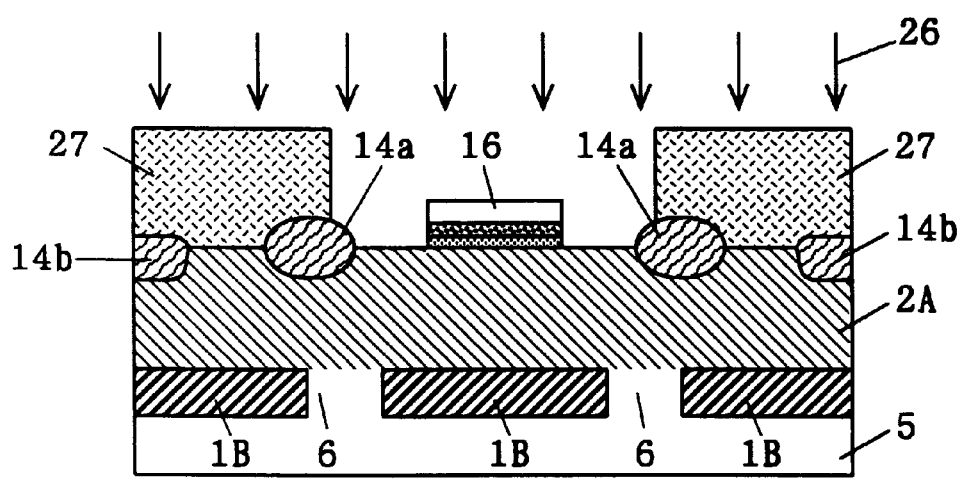
Figure 13A:
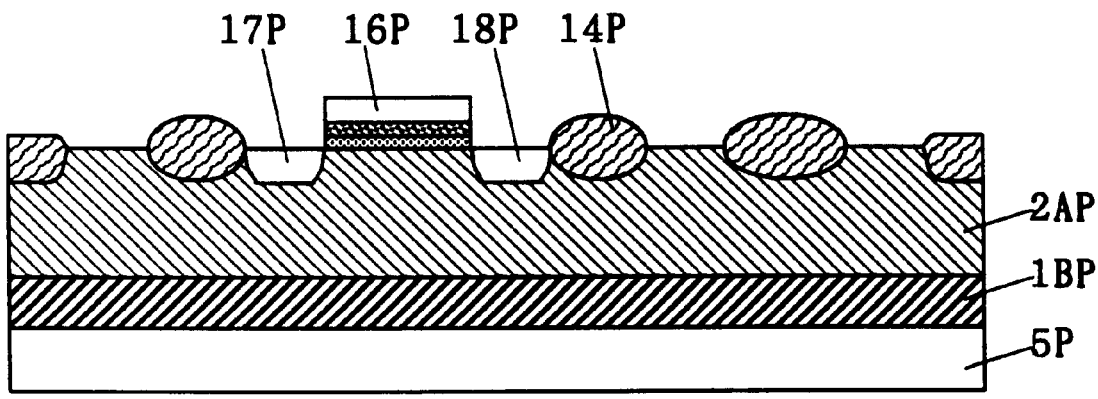
Figure 13B:
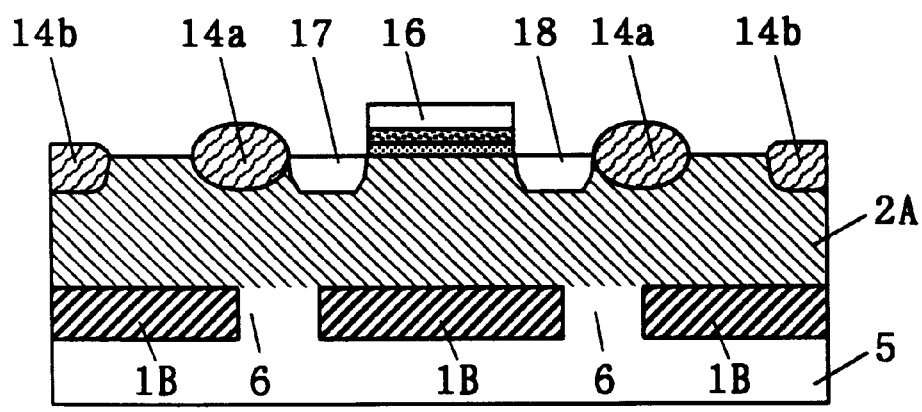
Figure 14A:
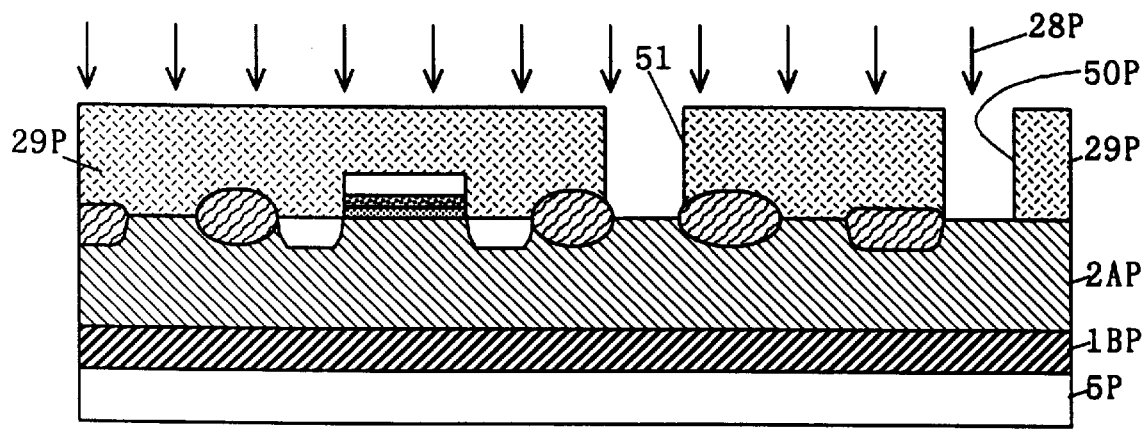

Next, a resist layer 27 having an opening pattern in the active area between opposite sides of the insulation layer portion 14a is formed as depicted in FIG. 12B. Using the resist layer 27 as a mask, N-type ions 26 such as arsenic are implanted from the exposed surface 5S into the substrate 5 to form the first and second transistor regions 17 and 18 serving as the source/drain regions. Thereafter, the resist layer 27 is removed (FIG. 13B).

A resist layer 29 is formed to cover the exposed surface 5S, the insulation layer 14, and the transfer gate 16. An opening pattern 50 for formation of the contact region 4 of FIG. 3 is formed in the resist layer 29. In the background art process shown in FIG. 14A, an unnecessary opening pattern 51 must also be formed in the resist layer 29P. Using the resist layer 29 as a mask, ions 28 such as BF$_2$ are implanted to form the P$^+$ type contact region 4. Thereafter, the resist layer 29 is removed (FIG. 15B).

Figure 14B:
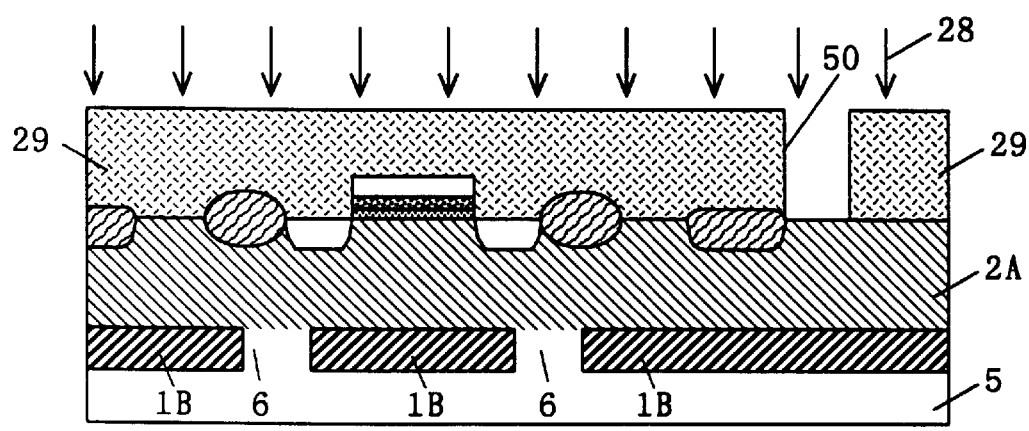
Figure 15A:
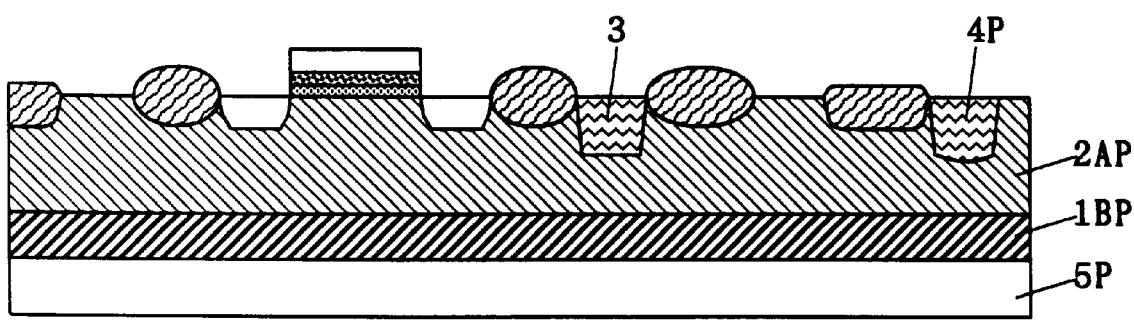
Figure 15B:
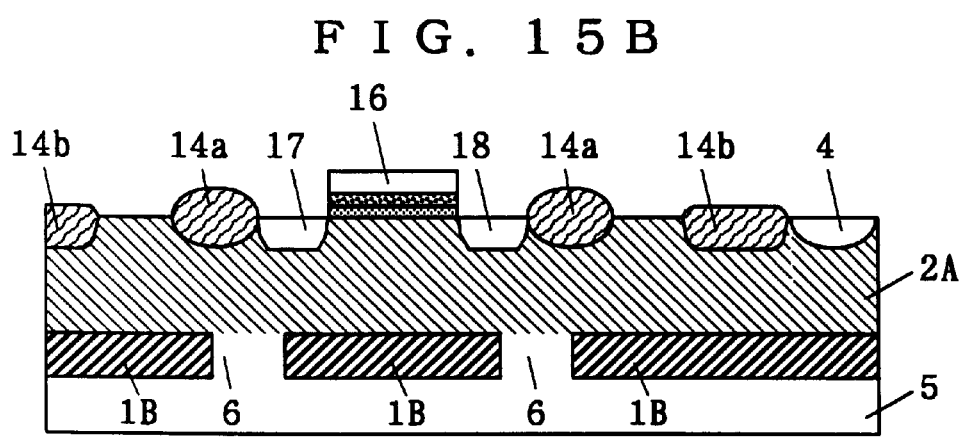

In the case where the structure of FIG. 3 is applied to an NMOS transistor of a CMOS circuit device, the steps shown in FIGS. 14B and 15B function as a P-channel implantation step for a PMOS transistor as well as the step of forming the P$^+$ contact layer 4.

(4) Fourth Step (N$^+$ channel implantation)

The fourth step is the step of forming the sidewall portion 1W of FIG. 3 between the second region (part of the surface 5S which is sandwiched between the insulation layer potions 14a and 14b) adjacent the first region of the surface 5S defined by the outer edges of opposite sides of the insulation layer portion 14a and a part of the upper surface of the bottom portion 1B which is positioned immediately under the second region.

Figure 16A:
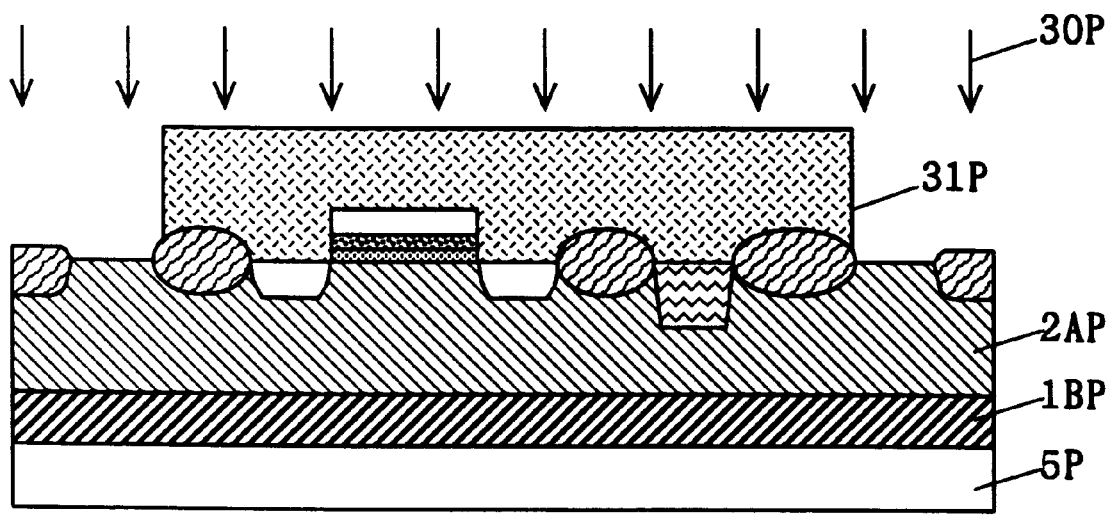
Figure 16B:
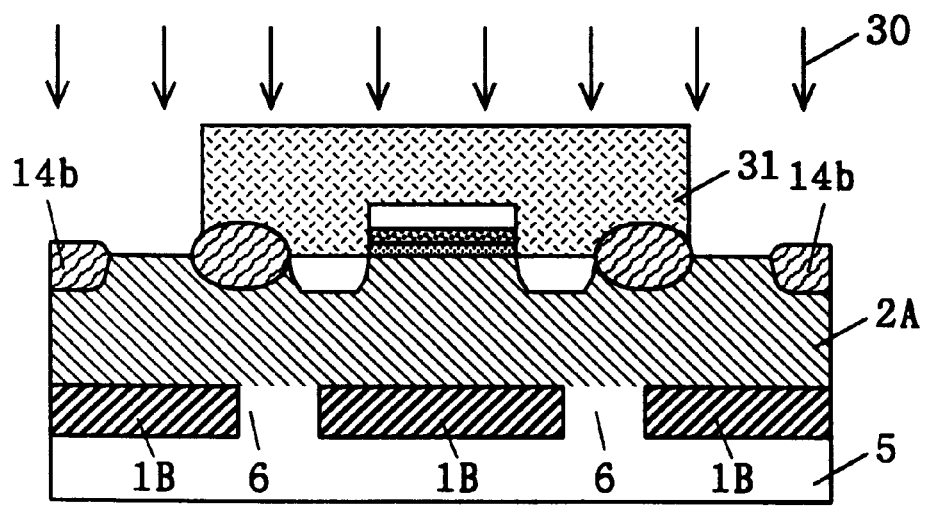
Figure 17A:
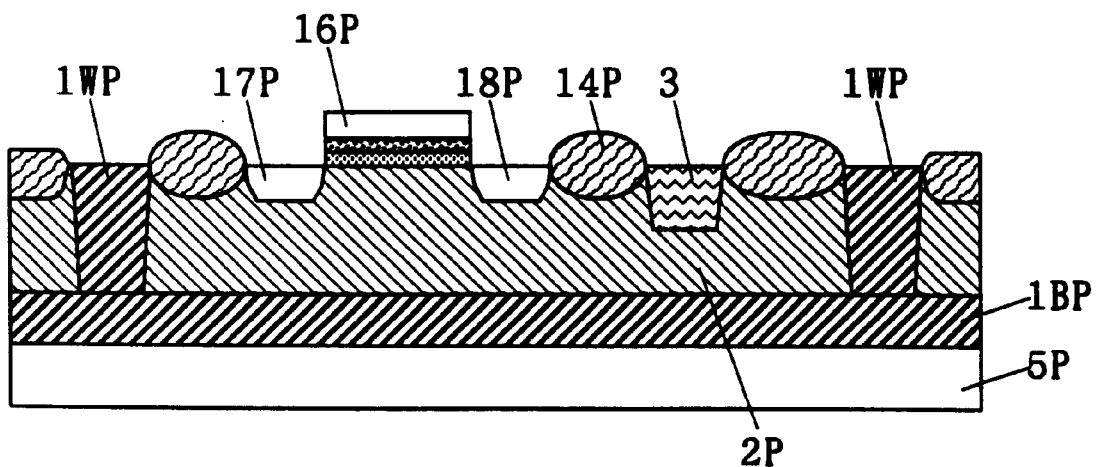
Figure 17B:
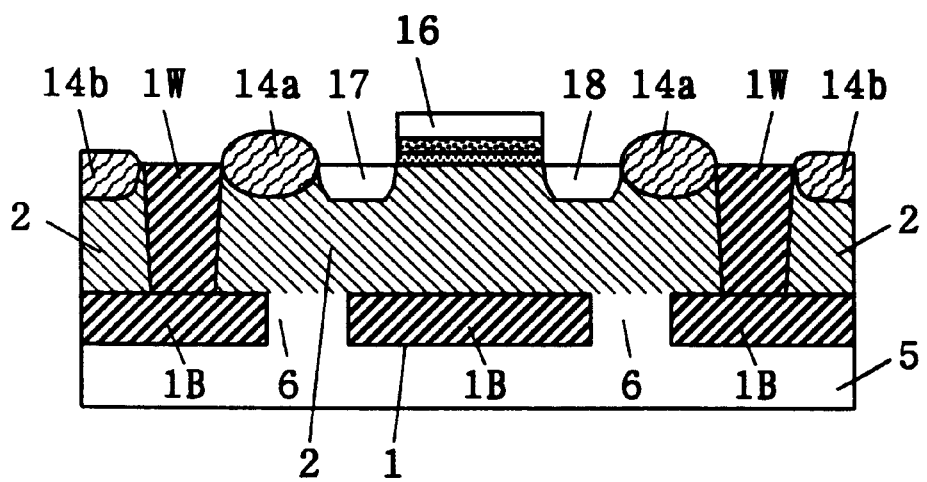

First, as illustrated in FIG. 16B, a resist layer 31 is formed to cover the surface 5S within the first region, the surface of the transfer gate 16, and the surface of the insulation layer portions 14a and 14b. Using the resist layer 31 as a mask, N-type ions such as arsenic are implanted from the exposed surface 5S in the second region into the substrate 5 to the depth D1 to form the N$^+$ type sidewall portion 1W coupled to the bottom portion 1B. Thereafter, the resist layer 31 is removed (FIG. 17B).

In this manner, the N$^+$ type second well region 1 is completed. The first well region 2 is almost completely surrounded by the second well region 1 except the conduction regions 6.

(5) Subsequent Step

Contacts and metal interconnections are then formed by the conventional process, but the description thereof will be dispensed with.

As described above in detail, in the wafer process step (N-type ion implantation step) for fabricating the N-type well region 1 in the P-type semiconductor substrate 5, the mask device having the novel pattern is used to partially form the region which is not implanted with the N-type ions, providing such a structure that the portions 6 having the P-type properties remain partially in the N$^+$ type bottom portion 1B.

In the fabrication method according to the present invention, an additional process step is not required to leave the portions 6 having the P-type properties partially in the bottom portion 1B. But required is only the use of the mask (e.g., that of FIG. 6) provided by improving or changing the background art mask pattern so that the region which is not implanted with the N-type ions is partially formed during the production of the N-type well region as illustrated in FIGS. 7B and 8B in place of the background art photomask used in the background art N-type ion implantation step. This fabrication method does not require new fabrication facilities and an additional step, accomplishing easy fabrication of the triple-well structure of the present invention.

(Second Preferred Embodiment)

In the first preferred embodiment, the triple-well structure is applied to the MOS transistor used singly as the active device and to one of the MOS transistors of the CMOS circuit. The technical concept of the present invention represented by the first preferred embodiment may be applied to a memory cell array block, as will be described in a second preferred embodiment.

Figure 18:
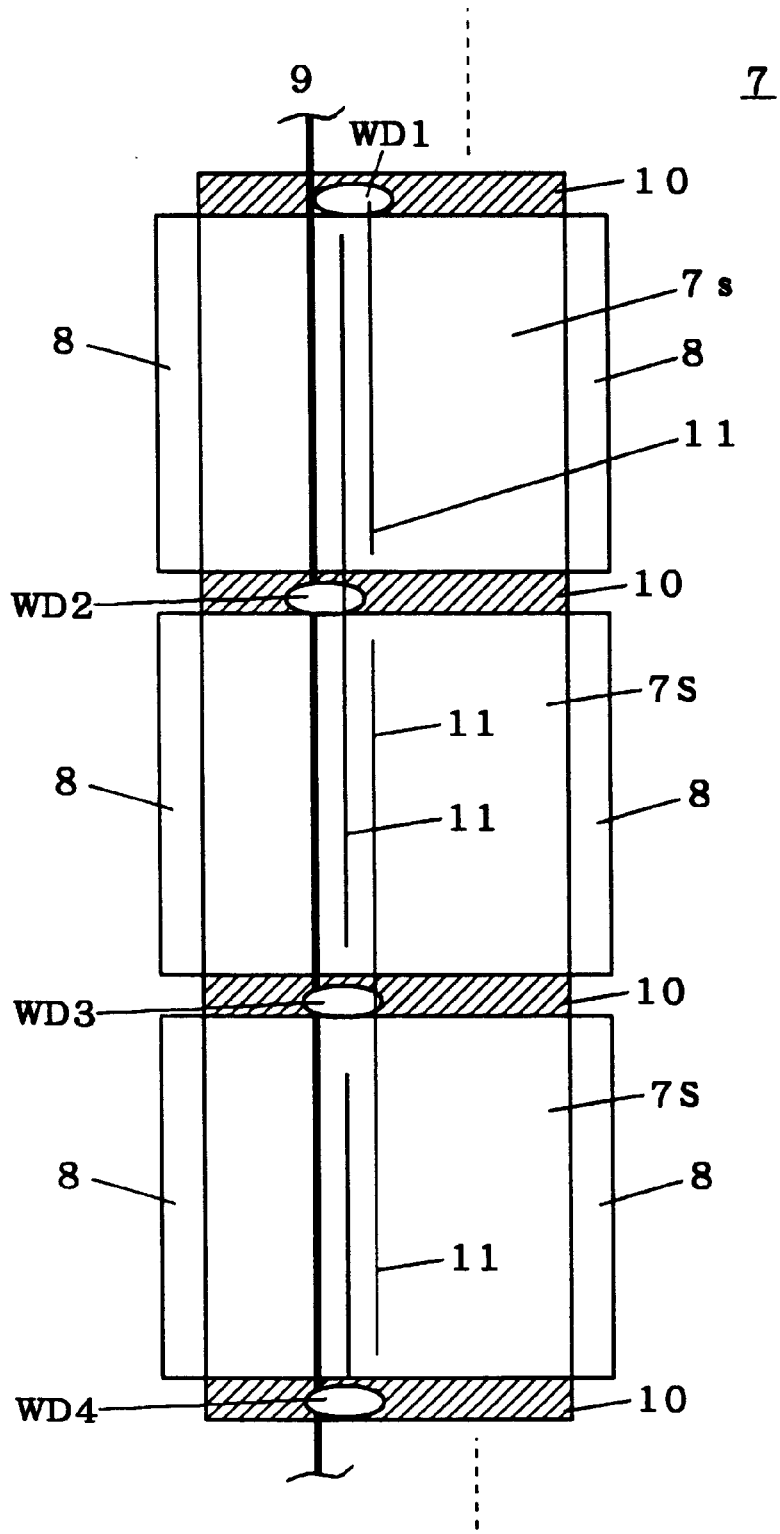
FIG. 18 is a schematic plan view of a DRAM memory cell array block having a divided word line structure.

FIG. 18 is a schematic plan view of a DRAM memory cell array block 7 having the divided word line structure. The block 7 comprises a plurality of sub-blocks 7S, a low-resistance main word line 9 which is an Al interconnect wire, word drivers WD1, WD2, WD3, . . . provided respectively for the sub-blocks 7S and connected to the main word line 9, and thin sub-word lines 11 of poly Si each of which are provided between two adjacent sub-blocks 7S and which are connected respectively to the corresponding word drivers. Sense amplifier circuit bands 8 and sub-decode circuit bands 10 are provided on all sides of each of the sub-blocks 7S to define the area of each sub-block 7S.

Figure 19:
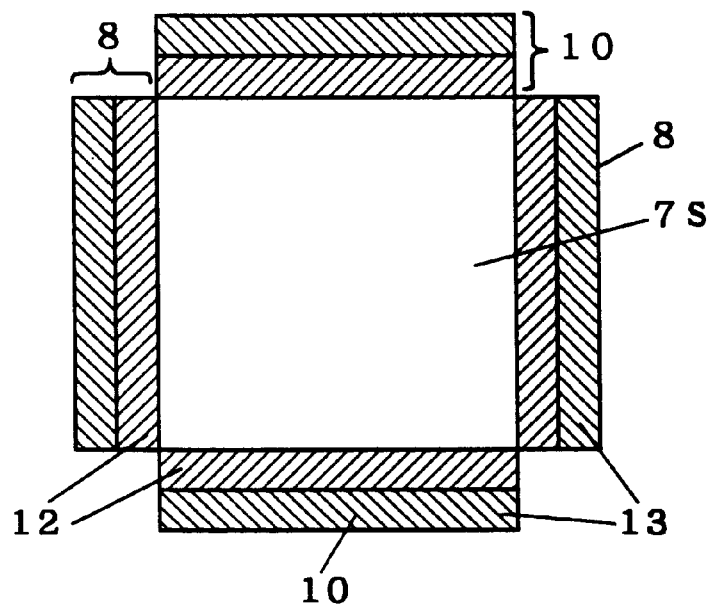
FIG. 19 is a schematic plan view of a memory cell array sub-block surrounded by N-type well regions.

FIG. 19 is an enlarged plan view of each of the memory cell sub-blocks 7S of FIG. 18. Since the circuit bands 8 and 10 are comprised of CMOS transistors as above described, each sub-block 7S is surrounded by N-type well regions 12 for PMOS transistors. This creates the above described background art problem.

In the second preferred embodiment, the structure discussed in the first preferred embodiment with reference to FIGS. 1 and 2 is applied to an NMOS transistor of each basic memory cell in each sub-block 7S. As discussed in the first preferred embodiment, the area of the MOS transistor of each basic memory cell of the second preferred embodiment is less than that of the prior art shown in FIG. 22, achieving size reduction of each basic memory cell. Therefore, when each sub-block 7S is surrounded by only the N-type well regions, a group of basic memory cells including the NMOS transistors having the triple-well structure may be readily formed in the memory cell sub-block 7S without the prior art problem. As described in the first preferred embodiment, the potential may be supplied to the P-type first well region through the conduction regions while the original functions and effects of the triple-well structure are sufficiently maintained, and the fabrication method is required only to suitably form the masking resist pattern for use in the N-type ion implantation step in accordance with the position of the conduction regions to be formed by simply changing the existing photomask pattern for formation of the above described resist pattern.

(Modification of Second Preferred Embodiment)

The modification of the first preferred embodiment shown in FIGS. 3 and 4 is applied to an NMOS transistor (FIG. 20) in each basic memory cell BMC of each memory cell array sub-block 7S shown in FIGS. 18 and 19. FIG. 21 is a cross-sectional view of a structure to which the modification is applied. As illustrated in FIG. 21, electrode layers 40 and 41 are formed on the source/drain regions 17 and 18 of each of NMOS transistors $15_1$ to $15_n$, and the electrode layer 41 is connected to a capacitor of the basic memory cell not shown. Overlying interlayer dielectric films and contact interconnect layers are not illustrated in FIG. 21.

Figure 20:
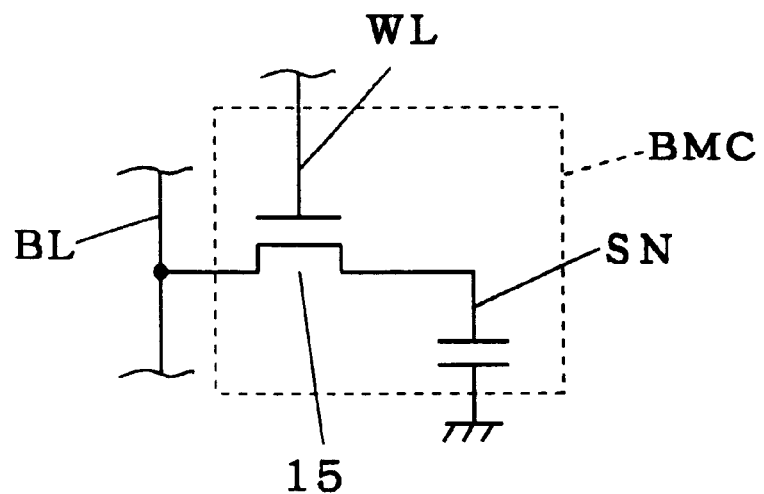
FIG. 20 illustrates a basic memory cell.
Figure 21:
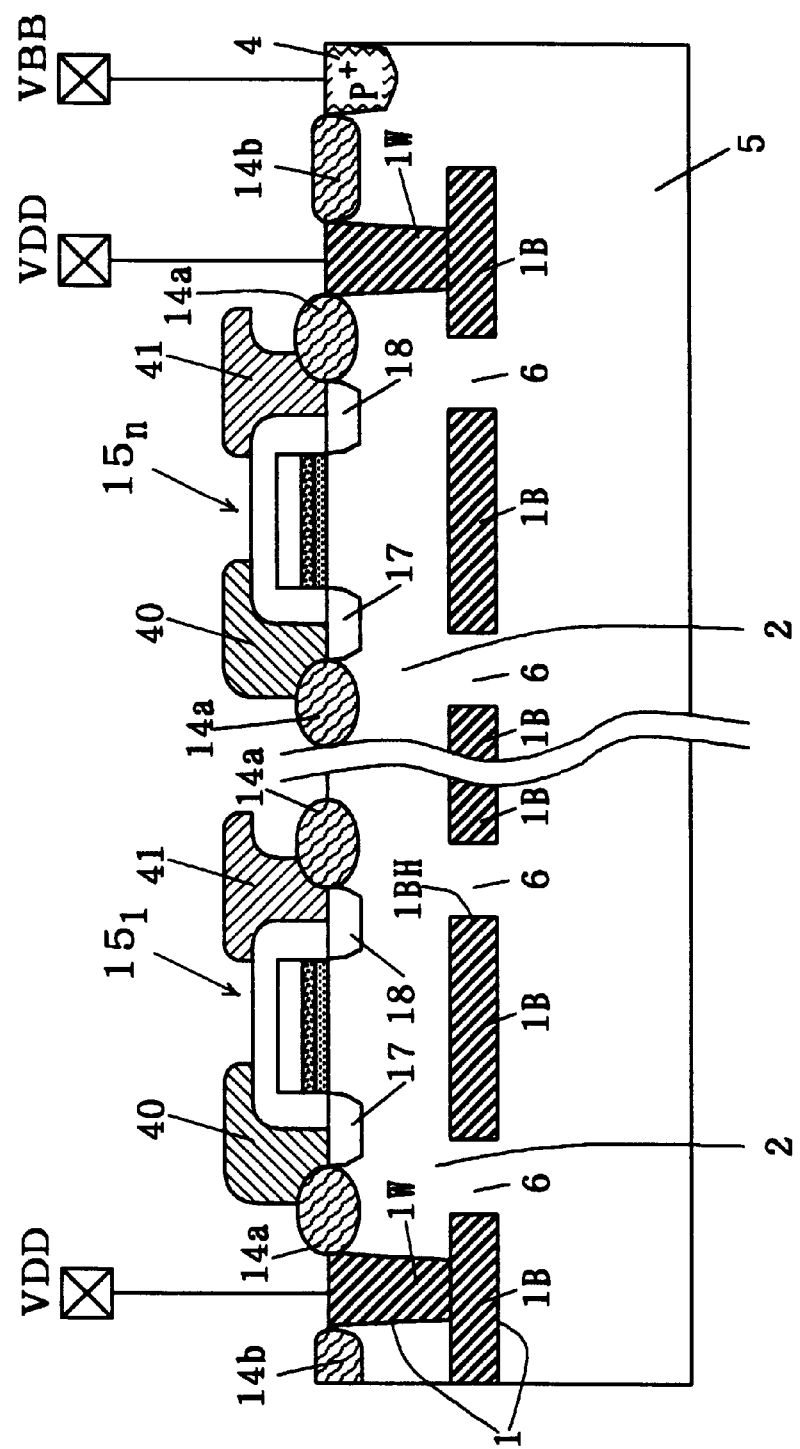
FIG. 21 is a cross-sectional view of a modification of a second preferred embodiment according to the present invention.

In this structure, the conduction regions 6 are formed in the bottom portion 1B immediately under other than the source/drain regions 18 of FIG. 21 corresponding to a storage node SN of FIG. 20 (and immediately under other than the transfer gates 16). This structure completely prevents the minority carriers (holes) injected through the conduction regions 6 from flowing into the storage node SN and then destroying the data in the capacitor (not shown in FIG. 21 but corresponding to the capacitor of FIG. 20). From this viewpoint, the modification of the second preferred embodiment is more advantageous than the application of the structure of FIGS. 1 and 2 to the memory cell array.

As above described, the modification of the second preferred embodiment is characterized in that the conduction regions 6 for establishing electrical connection between the P-type well region 2 and the P-type semiconductor substrate 5 shown in FIGS. 3 and 4 are formed immediately under other than the source/drain regions of the NMOS transistors corresponding to the storage node of the basic memory cell in the memory cell array block.

(Characteristic Effects of First and Second Preferred Embodiments)

(1) The first preferred embodiment is not required to produce the contact region for supplying potential to the P-type well region in the P-type well region to provide a smaller area than the background art triple-well structure by the amount of the area of the contact region for supplying the potential to the background art P-type well region. The novel mask device is produced so that the regions which are not implanted with the N-type ions by the use of the mask pattern are arranged uniformly on average in the bottom of the $N^+$ type well region opposed to the bottom of the P-type well region, facilitating the even supply of the potential of the P-type well region through the P-type semiconductor substrate. Additionally, suitable setting of the conduction regions positioned immediately under other than the transistor regions may prevent the influence of the minority carrier injection current.

(2) The second preferred embodiment permits the potential to be supplied from the semiconductor substrate to the P-type well region in the memory cell array block 7 without the provision of the contact region for fixing the potential in the memory cell array block 7 of FIG. 19. Unlike the structure wherein the bottom portion 1B of the $N^+$ type well region is produced so that the conduction regions 6 are formed immediately under the storage node (FIG. 1), the structure of the modification wherein the N-type well region is located immediately under the storage node may prevent the minority carrier current injected from the semiconductor substrate from reaching the storage node, ensuring the prevention of damages to the memory cell data due to the carrier current injection.

While the invention has been described in detail, the foregoing description is in all aspects illustrative and not restrictive. It is understood that numerous other modifications and variations can be devised without departing from the scope of the invention.

What is claimed is:

1. A semiconductor circuit device comprising:
a semiconductor substrate of a first conductivity type;
a first well region of said first conductivity type extending from a first region of a surface of said semiconductor substrate into said semiconductor substrate;
a second well region of a second conductivity type including a sidewall portion extending in a first direction from a second region of said surface of said semiconductor substrate adjacent said first region into said semiconductor substrate and including a bottom portion then extending in a second direction, different from the first direction, into said semiconductor substrate so as to surround said first well region on at least two sides;
at least one transistor comprising first and second transistor regions of said second conductivity type extending from said first region of said surface of said semiconductor substrate into said first well region, and a third transistor region formed on said first region of said surface between said first and second transistor regions;

at least one conduction region formed partially in said bottom portion of said second well region for providing electrical continuity between said first well region and said semiconductor substrate, and wherein parts of said sidewall portion located on said at least two sides are electrically connected to each other by said bottom portion; and a contact region for supplying a predetermined potential to said first well region, formed on said semiconductor substrate except at said first well region.

2. The semiconductor circuit device according to claim 1, wherein said at least one conduction region is of said first conductivity type.

3. The semiconductor circuit device according to claim 2, wherein said at least one conduction region comprises a plurality of conduction regions formed throughout said bottom portion of said second well region.

4. The semiconductor circuit device according to claim 2, wherein said at least one conduction region is formed in other than parts of said bottom portion which are located immediately under said first, second, and third transistor regions.

5. The semiconductor circuit device according to claim 2, further comprising:

a first insulation layer portion formed in a part of said first region which surrounds said first and second transistor regions and is surrounded by said sidewall portion of said second well region, said first insulation layer portion for bounding said first region; and a second insulation layer portion formed in a part of said surface of said semiconductor substrate which is located adjacent to and exteriorly of said second region so as to surround said second region, wherein said contact region extends from a part of said surface of said semiconductor substrate which is located exteriorly of said second insulation layer portion into said semiconductor substrate.

6. The semiconductor circuit device according to claim 2, further comprising:

a first insulation layer portion formed in a part of said first region which surrounds a first and second transistor regions and is surrounded by a sidewall portion of said second well region, said first insulation layer portion for bounding said first region, wherein said at least one conduction region is formed in a part of said bottom portion which is located immediately under said first insulation layer portion.

7. The semiconductor circuit device according to claim 2, wherein said semiconductor circuit device is a memory cell array block, comprising a plurality of sub-blocks, and said at least one transistor includes a plurality of transistors corresponding respectively to MOS transistors of basic memory cells in each of said plurality of sub-blocks.

8. The semiconductor circuit device according to claim 7, wherein said at least one conduction region comprises a plurality of conduction regions formed throughout said bottom portion of said second well region.

9. The semiconductor circuit device according to claim 7, wherein said at least one conduction region is formed in other than parts of said bottom portion which are located immediately under said first, second, and third transistor regions.

10. The semiconductor circuit device according to claim 2, wherein said at least one conduction region is formed by implanting ions of said second conductivity type into a predetermined part of said semiconductor substrate to form said bottom portion so that said ions are not implanted into a part of said predetermined part of said semiconductor substrate.

11. The semiconductor circuit device according to claim 1, wherein said second well region surrounds said first well region on four sides.

12. A mask device for fabrication of a semiconductor circuit device having a triple-well structure in a semiconductor substrate, said mask device comprising:

a mask pattern for forming at least one opening pattern in a part of a bottom portion of a second well region of a second conductivity type for surrounding a first well region of a first conductivity type wherein regions of a transistor are to be formed by including a sidewall portion extending in a first direction from a surface of said semiconductor substrate into said semiconductor substrate and including said bottom portion extending in a second direction, different from said first direction, into said semiconductor substrate so as to surround said first well region on at least two sides, wherein parts of said sidewall portion located on said at least two sides of said first well regions are electrically connected to each other by said bottom portion, in a wafer process step of forming said bottom portion in said triple-well structure.

* * * * *